United States Patent [19]

Bovermann

[11] Patent Number: 4,561,710
[45] Date of Patent: Dec. 31, 1985

[54] SUBRACK FOR ELECTRONIC MODULES, PARTICULARLY PRINTED CIRCUIT BOARDS

[75] Inventor: Klaus-Dieter Bovermann, Breidenbach-Niederdieten, Fed. Rep. of Germany

[73] Assignee: Rittal-Werk Rudolf Loh GmbH & Co. KG, Fed. Rep. of Germany

[21] Appl. No.: 549,460

[22] Filed: Nov. 7, 1983

[30] Foreign Application Priority Data

Nov. 6, 1982 [DE] Fed. Rep. of Germany ....... 3241016

[51] Int. Cl.⁴ .................. H05K 1/00; H01R 13/20
[52] U.S. Cl. .................. 339/17 M; 211/41; 339/65; 361/415; 361/427
[58] Field of Search .................. 339/65, 17 M, 31 R, 339/119 R, 125 R; 361/413, 415, 427; 211/41; 248/201; 312/187, 193

[56] References Cited

U.S. PATENT DOCUMENTS

| | | | |
|---|---|---|---|
| 3,601,661 | 8/1971 | Kleinhample, Jr. | 361/415 |
| 3,711,814 | 1/1973 | Pamella et al. | 339/65 |
| 3,798,507 | 3/1974 | Damon et al. | 361/415 |
| 3,939,382 | 2/1976 | Lacan et al. | 361/415 |
| 4,201,303 | 5/1980 | Smith | 361/415 |

OTHER PUBLICATIONS

Deutsche Industrie Norm 41 617, Feb. 1983; 41 612, Jul. 1981.

Primary Examiner—Gil Weidenfeld
Assistant Examiner—Gary F. Paumen
Attorney, Agent, or Firm—Thomas W. Speckman

[57] ABSTRACT

This invention relates to a subrack with side walls connected by means of cross-pieces, in which electronic modules, particularly printed circuit boards, can be placed. The modules have terminal strips on their rear edges which can be inserted into electrical connectors facing towards them mounted in the rear area of the subrack at a predetermined depth from the plane of the front panel. Through the design and arrangement of two mounting bars in the rear area of the subrack, using the same components of the subrack, different electrical connectors may be selectively mounted to receive terminal strips of electronic modules of different sizes.

19 Claims, 4 Drawing Figures

SUBRACK FOR ELECTRONIC MODULES, PARTICULARLY PRINTED CIRCUIT BOARDS

BACKGROUND OF THE INVENTION

1. Field of the Invention

This invention relates to a subrack with side walls connected by means of cross-pieces, in which electronic modules, particularly printed circuit boards, can be placed. The modules have terminal strips on their rear edges which can be inserted into electrical connectors facing towards them mounted in the rear area of the subrack in a mounting plane, the electrical connectors being at a predetermined distance from the mounting plane of the front panel.

2. Description of the Prior Art

Different subracks of this general type are known. These differ essentially in constructive assembly, that is to say, in the formation of the side walls and of cross-pieces, as well as devices for securing the electrical connectors. Different terminal strips, for example, in accordance with DIN (Deutsche Industrie Norm) 41 612 or DIN 41 617, can be used for the modules, particularly printed circuit boards. This requires that subracks with electrical connectors in accordance with DIN 41 612 and subracks with electrical connectors in accordance with DIN 41 617 must also be made available, since the electrical connectors, in accordance with DIN 41 612 and DIN 41 617, exhibit different mounting distances, for example, 90 mm and 85 mm, between their mounting bores in both flanges, and since the rear mounting planes for these different types of electrical connectors also are at different standard distances, for example, 175.24 mm or 235.24 mm, and 170.6 mm or 230.6 mm, from the mounting plane of the front panel of the subrack.

Subracks are known in which a mounting flange with a series of threaded apertures is mounted on the rear cross-piece. These subracks are, however, suited for mounting electrical connectors in accordance with DIN 41 612, or electrical connectors in accordance with DIN 41 617, and for the reception of modules with terminal strips, in accordance with DIN 41 612, or modules and terminal strips in accordance with DIN 41 617. Thus, two types of subracks must always be produced, and supported on the support.

SUMMARY OF THE INVENTION

It is an object of this invention to provide a subrack of the type mentioned above, which can be mounted quickly and easily, and selectably, with electrical connectors of one type or the other; for example, in accordance with DIN 41 612 or in accordance with DIN 41 617, and then can be used for the reception of modules with terminal strips of one type or the other, for example, in accordance with DIN 41 612 or in accordance with 41 617.

This object is achieved in accordance with this invention in this manner; two mounting bars, each with two mounting flanges, are provided for selectable mounting of electrical connectors of a first or second type. These can be mounted in two different positions on the subrack rotated around their longitudinal axis, and in the mounting flanges are rows of threaded apertures in predetermined spacing, so that, in the first position of the mounting bars, the one pair of mounting flanges with their mounting surfaces turned parallel to the mounting plane of the front panel form the rear mounting plane for the first type of electrical connectors at the distance from the mounting plane of the front panel which is necessary for them. Both rows of threaded apertures in these mounting flanges occupy the mounting distance which is necessary for the mounting of the electrical connectors between the mounting bores in the flanges of the electrical connectors of the first type. In the second position of the mounting bars, the other pair of mounting flanges, with their mounting surfaces parallel to the mounting plane of the front panel, forms the rear mounting plane for the second type of electrical connectors at the distance from the mounting plane of the front panel which is necessary for them, and both the rows of threaded apertures in these mounting flanges occupy the mounting distance, necessary for the mounting of the electrical connectors of the second type, between the mounting bores in the flanges of the electrical connectors of the second type.

Through this embodiment, and selectable fastening of both the mounting bars, it is possible to lay out uniform components of the subrack, as well as to accommodate the modules with terminal strips of two types, for example, in accordance with DIN 41 612, or in accordance with DIN 41 617. Consequently, not only can storage be simplified, but the production of the subracks can be carried out more efficiently.

The mounting of the mounting bars is, in one embodiment, so undertaken that the mounting bars are positioned in the area of the rear cross-piece of the subrack and are connected with the side walls. In this way, the cost of the subrack can be further reduced, since the mounting bars are used as the rear cross-piece of the subracks and are connected with the side walls. In both cases, it can be provided that blind-end bores or blind-end threaded bores are placed in the ends of the mounting bars, and that the mounting screws are inserted and screwed into the blind-end bores or blind-end threaded bores by means of apertures in the side walls.

The mounting bars can also, in a further embodiment, be positioned in the area of the rear cross-piece of the subrack and be connected thereto. Consequently, independently of the position of the mounting bars, even mounting spots can be employed on the side walls or on the cross-pieces. A further embodiment provides that both mounting flanges of the mounting bars are at a right angle to one another and exhibit different lengths adjusted to the mounting distances of the electrical connectors of the first and second type, and that the mounting flanges of the mounting bars exhibit, in relation to a parallel corresponding plane intersecting the central axis of the frontal blind-end bores or blind-end threaded bores, various lateral displacements; and that the difference of these displacements corresponds approximately to the difference of the distances of the rear mounting planes for the electrical connectors of the first and second type of the mounting depths from the front panel as well as that the central axes of the rows of threaded apertures in the mounting flanges, vertical to the central axis of the blind-end bores or blind-end threaded bores, exhibit various distances from the front panel; and that the difference of these distances corresponds to approximately half the difference of the mounting distances of the electrical connectors of the first and second types.

If, in accordance with one embodiment, it is provided that the mounting bars have an essentially rectangular cross section, and that both the mounting flanges are fitted to the two sides of the mounting bars adjacent one another, then the mounting bars need to each be rotated by only 90° around their longitudinal axes, in order to occupy the other position. Consequently, both the mounting bars are identically formed, though rotated by 180°, that is to say, with changed ends, and are connected with the side walls or the cross-pieces of the subrack. In both positions, the associated pairs of mounting flanges are each aligned opposite one another.

The adjustment of the mounting bars to the subrack occurs, in accordance with one advantageous embodiment, in such a way that the mounting bars, in each mounting position, are non-rotatably braced against the bars of the side walls. The mounting bars can then be secured non-rotatably at their ends themselves by a single blind-end bore or blind-end threaded bores placed frontally.

In order to be able to mark the modules installed in the subracks, even in the area of the electrical connectors, a further embodiment provides that the side turned in both positions of the mounting bars at the rear of the subrack is provided with reception grooves for marking strips.

DESCRIPTION OF PREFERRED EMBODIMENTS

Figure 1:
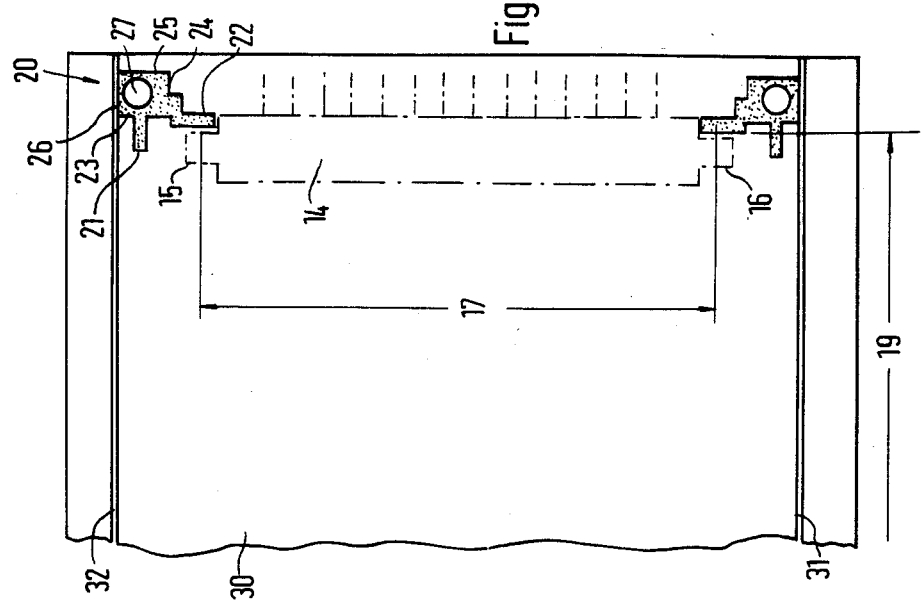
FIG. 1 shows a partial view, in the rear area of the subrack, with two mounting bars connecting the side walls, in the position with attached electrical connectors of the first type, in accordance with DIN 41 612.
Figure 3:
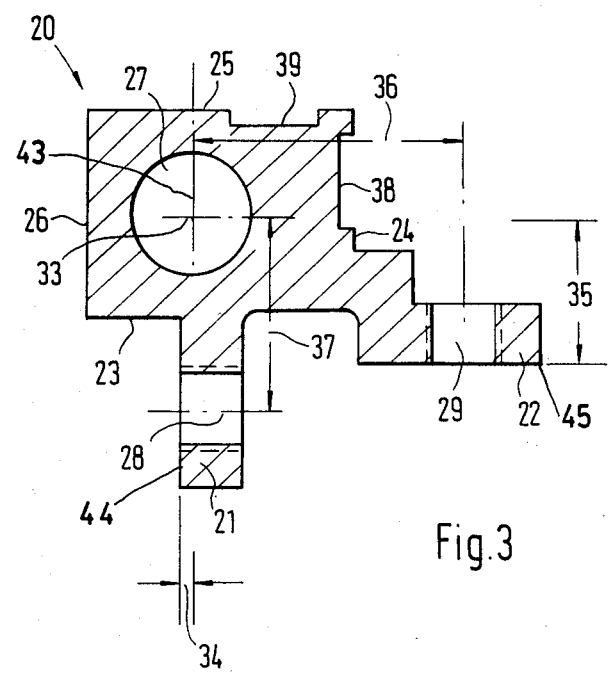
FIG. 3 shows an enlarged cross section through one embodiment of a mounting bar.
Figure 4:
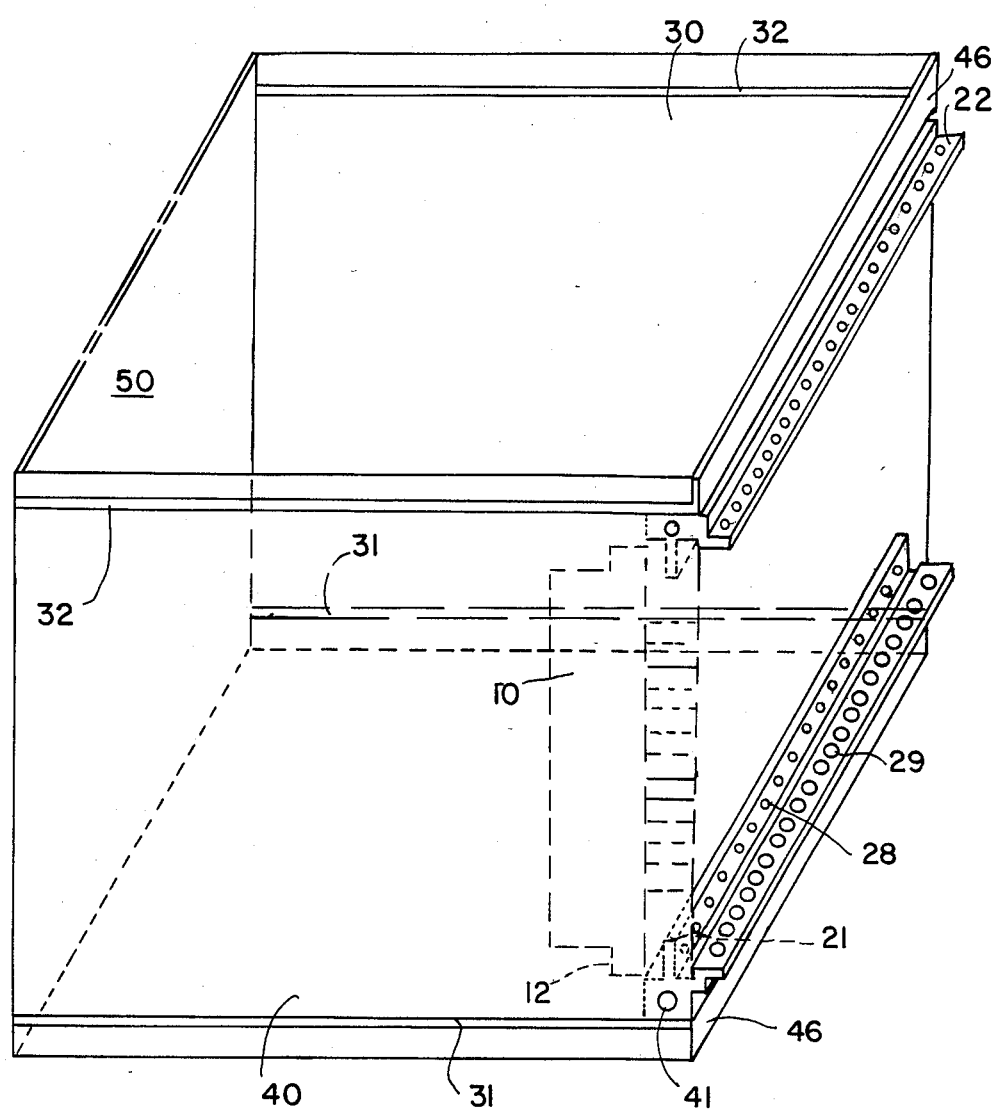
FIG. 4 shows a perspective view with two mounting bars and cross-pieces connecting the side walls.

The partial view in accordance with FIG. 1 shows, in outline, an electrical connector (10) in accordance with DIN 41 612, in which the mounting distance (13) between the mounting bores in both the flanges (11 and 12) of the electrical connectors is, for example, 90 mm. The mounting depth (18) for electrical connectors (10) is defined by the distance between mounting surfaces of mounting flange (21) of both mounting bars (20) and the mounting plane of the front panel of the subrack. The distance of mounting depth (18) is, according to the size of the modules, 175.24 mm, if the modules support terminal strips in accordance with DIN 41 612. Mounting bars (20) are formed identically, however, with reversed ends, that is to say, rotated longitudinally 180°, and connected with side walls (30,40) of the subrack. Moreover, as the section in accordance with FIG. 3 shows, blind-end bores (27) or blind-end threaded bores can be placed in the end areas. The mounting screws are inserted through bores (41) in side walls (30,40), and are screwed into blind-end bores (27) or blind-end threaded bores of mounting bars (20). In the example of construction given, mounting bars (20) serve simultaneously as rear cross-pieces of the subrack. Mounting bars (20) can, however, also be additionally provided to rear cross-pieces (46), and connected with these as shown in FIG. 4.

Mounting bars (20) are each provided with two mounting flanges (21 and 22), which are positioned at right angles to one another, and are fitted to the two sides (23 and 24) adjacent one another of the essentially rectangular mounting bar (20), as is seen in FIG. 3. In this way, mounting flange (21) is fitted to side (23) and mounting flange (22) to side (24). Sides (25 and 26) form contact spaces, which abut fitted bars (31 and 32) connected to side walls (30,40), to non-rotatably secure mounting bars (20).

In the embodiment for electrical connectors (10) in accordance with DIN 41 612, mounting bars (20) are so mounted that mounting flanges (21) are aligned opposite to one another, and, with the mounting surfaces turned to the forward side, form a rear mounting plane. The lateral displacement (34) of the mounting surfaces (44) of mounting flange (21) to a parallel corresponding plane (43) intersecting the central axis of blind-end bores (27) is thereby so selected, that mounting depth (18) occupies the specified distance of 175.24 mm or 235.24 mm, between mounting surface (44) and the mounting plane 50 of the front panel of the subrack. Sides (25) of mounting bars (20) abut bars (31 and 32) connected to side walls (30,40), to non-rotatably secure mounting bars (20) in this first position.

Figure 2:
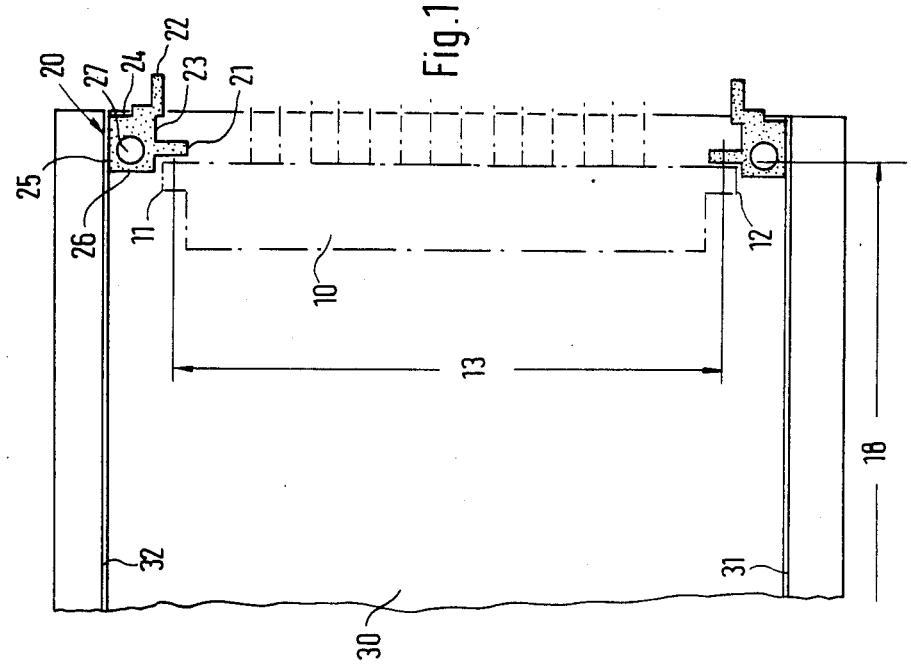
FIG. 2 shows the same partial view, in which the mounting bars are rotatably attached 90° around their longitudinal axes, and serve to mount the electrical connectors of the second type, for example, in accordance with DIN 41 617.

As FIG. 2 shows, both mounting bars (20) may be detached from the side walls (30, 40), rotated 90° around their longitudinal axes and fastened to side walls (30, 40) again in the same manner as described above. The upper mounting bar (20) is thereby turned in a clockwise manner, and the lower mounting bar (20) is turned counterclockwise around the longitudinal axis. In this way, the second position, in which mounting flanges (22) are adjusted toward one another, is achieved, and, with the mounting surfaces turned toward the forward side, mounting depth (19) for electrical connectors (14) is defined in accordance with DIN 41 617. The distance of mounting depth (19) for electrical connectors (14), from the rear mounting plane to the front panel, is accordingly spaced at 170.6 mm or 230.6 mm. The lateral displacement (35) of the mounting surfaces (45) of mounting flange (22) to a parallel corresponding plane (33) intersecting the central axis of blind-end bores (27) or blind-end threaded bores is correspondingly greater, in order to maintain the necessary smaller distance of mounting depth (19) for electrical connectors (14) from the mounting plane for the front panel, in accordance with DIN 41 617.

The difference of the displacements (34 and 35) of mounting flanges (21 and 22) corresponds approximately to the difference of the distances of mounting depths (18 and 19) for electrical connectors (10 and 14) from the mounting plane to the plane of the front panel in accordance with DIN 41 612 and DIN 41 617.

Since electrical connectors (10 and 14), in accordance with DIN 41 612 and DIN 41 617, also have varying mounting distances (13 and 17) between the mounting bores in their flanges (11, 12) and (15, 16), mounting flanges (21 and 22) must also undergo an adjustment. Both mounting flanges (21 and 22) of mounting bar (20) exhibit a series of threaded apertures (28 and 29), which are placed at a specified spacing of, for example, 5.08 mm. The central axes of threaded apertures (28) in mounting flange (21) are parallel to plane (33) intersecting the central axis of blind-end bores (27) or blind-end threaded bores, at a distance (37), which is so measured that, with observation of the mounting points of mounting bars (20) at side walls (30, 40), and lateral displacement (34) of mounting flange (21), the rows of threaded apertures (28), in the position of mounting bars (20), occupy, in accordance with FIG. 1, mounting distance (13) for electrical connectors (10), in accordance with DIN 41 612.

The central axes of threaded apertures (29) in mounting flange (22) are parallel to plane (43) intersecting the central axis of blind-end bores (27) or blind-end threaded bores at a distance (36) which is so measured that, with consideration of the same mounting points of mounting bars (20) to side walls (30, 40), and of lateral displacement (35) of mounting flange (22), the rows of threaded apertures (29) in the position of mounting bars (20), in accordance with FIG. 2, occupy the mounting distance (17) for electrical connectors (14) in accordance with DIN 41 617. As can further be seen from FIG. 2, mounting bars (20) are fastened non-rotatably with their sides (26) abutting support bars (31 and 32) of side walls (30,40). The difference of the distances (36 and 37) corresponds to half the difference of mounting distances (13 and 17). Sides (24 and 25) of mounting bars (20), in accordance with FIG. 3, exhibit reception grooves (38 and 39), which can accommodate marking strips. Mounting bars (20) are cut to length, as desired, from sections of a corresponding profile line, in which blind-end bores (27) and blind-end threaded bores, and the series of threaded apertures (28 and 29), are subsequently placed.

I claim:

1. In a subrack comprising rigid side walls (30, 40) connected by cross-pieces (46) and having mounted in the rear area between said side walls, at a predetermined depth (18, 19) from the mounting plane (50) of a front panel, electrical connectors (10, 14) facing forward for receipt of terminal strips on the rear edges of electronic modules, the improvement comprising providing mounting means for the selectable mounting of said electrical connectors (10, 14) of a first and second type, said mounting means comprising two mounting bars (20) each having a first and second mounting flange (21, 22) extending outwardly therefrom, the mounting surface (44, 45), respectively, of each of said mounting flange having a different lateral displacement (34, 35), respectively, from a parallel corresponding plane (43, 33), respectively, intersecting the central axis of a bore (27) in said mounting bars, said mounting flanges having rows of threaded apertures (28, 29) therein at predetermined spacing, said mounting bars (20) connectable at their ends in a fixed, non-rotatable manner to said side walls (30, 40) in a first position with said mounting surfaces (44) of said first mounting flanges (21) providing mounting depth (18) suitable for said first electrical connectors (10) and said rows of threaded apertures (28) in said first mounting flanges (21) being separated by mounting distance (13) corresponding to said first type electrical connectors (10); and in a second position with the mounting surfaces (45) of said second mounting flanges (22) providing mounting depth (19) suitable for said second electrical connectors (14) and the rows of said threaded apertures (29) in said second mounting flanges (22) being separated by mounting distance (17) corresponding to said second type electrical connectors (14).

2. A subrack in accordance with claim 1, characterized by said mounting bars (20) being mounted in the area of said rear cross-pieces of said subrack, and connected with said side walls (30, 40).

3. A subrack in accordance with claim 1, characterized by said mounting bars (20) being used as rear cross-pieces of said subrack, and connected with said side walls (30, 40).

4. A subrack in accordance with claim 1, characterized by said bores (27) being placed in the ends of said mounting bars (20) and mounting screws being inserted and screwed into said blind-end bores (27) through bores (41) in said side walls (30, 40).

5. A subrack in accordance with claim 1, characterized by said mounting bars (20) being mounted in the area of said rear cross-pieces of the subrack, and being connected thereto.

6. A subrack in accordance with claim 1, characterized by both said mounting flanges (21, 22) of said mounting bars (20) being at right angles to one another, and having different dimensions for matching said mounting distances (13, 17) of said electrical connectors (10, 14) of said first and second type.

7. A subrack in accordance with claim 6, characterized by said mounting surfaces (44, 45) of said mounting flanges (21, 22) of said mounting bars (20), having different lateral displacements (34, 35) from said parallel corresponding planes (43, 33) intersecting said central axis of said bores (27) in the ends of said mounting bars (20), the difference of said displacements (34, 35) corresponding approximately to the difference of said mounting depths (18, 19) for said electrical connectors (10, 14) of said first and second type.

8. A subrack in accordance with claim 7, characterized by the central axes of said rows of threaded apertures (28, 29) in said mounting flanges (21, 22) being at distances (36, 37) from said parallel corresponding planes (33, 43) intersecting said central axis of said bores (27), the difference of said distances (36, 37) corresponding approximately to half the difference of said mounting distances (13, 17) of said electrical connectors (10, 14) of said first and second type.

9. A subrack in accordance with claim 8, characterized by said mounting bars (20) having an essentially rectangular cross-section, and that said mounting flanges (21, 22) extend from adjacent sides of said mounting bar (20).

10. A subrack in accordance with claim 9, characterized by said mounting bars (20) in said first and second positions abutting non-rotatably their flangeless sides (25, 26) against bars (31, 32) of said side walls (30, 40).

11. A subrack in accordance with claim 10, characterized by said mounting bars (20) being of identical form, each said mounting bar rotated end for end 180° with respect to each other and having identical pairs of said mounting flanges (21, 22), in both positions, aligned opposite one another.

12. A subrack in accordance with claim 11, characterized by sides (24, or 25) of said mounting bars (20) facing the rear of said subrack, being provided with reception grooves (38, 39) for marking strips.

13. A subrack in accordance with claim 1, characterized by said mounting surfaces (44, 45) of said mounting flanges (21, 22) of said mounting bars (20), having different lateral displacements (34, 35) from said parallel corresponding planes (43, 33) intersecting said central axis of said bore (27), the difference of said displacements (34, 35) corresponding approximately to the difference of the mounting depths (18, 19) for said electrical connectors (10, 14) of said first and second type.

14. A subrack in accordance with claim 1, characterized by the central axes of said rows of threaded apertures (28, 29) in said mounting flanges (21, 22) being at distances (36, 37) from said parallel corresponding planes (33, 43) intersecting said central axis of said bore (27), the difference of said distances (36, 37) corresponding approximately to half the difference of said mounting distances (13, 17) of said electrical connectors (10, 14) of said first and second type.

15. A subrack in accordance with claim 1, characterized by said mounting bars (20) having an essentially rectangular cross-section, and that said mounting flanges (21, 22) extend from adjacent sides of said mounting bar (20).

16. A subrack in accordance with claim 1, characterized by said mounting bars (20) being of identical form, each said mounting bar rotated end for end 180° with respect to each other and having identical pairs of said mounting flanges (21, 22), in both positions, aligned opposite one another.

17. A subrack in accordance with claim 16, characterized by sides (24, or 25) of said mounting bars (20) facing the rear of said subrack, being provided with reception grooves (38, 39) for marking strips.

18. A subrack in accordance with claim 1, characterized by said mounting flanges (21, 22) of said mounting bars (20) being at right angles to one another, and having different lengths for matching said mounting distances (13, 17) of said electrical connectors (10, 14) of said first and second type; said mounting surfaces (44, 45) of said mounting flanges (21, 22) of said mounting bars (20), having different lateral displacements (34, 35) from said parallel corresponding planes (43, 33) intersecting said central axis of bore 27, the difference of said displacements (34, 35) corresponding approximately to the difference of mounting depths (18, 19) for said electrical connectors (10, 14) of said first and second type; and the central axes of said rows of threaded apertures (28, 29) in said mounting flanges (21, 22) being at distances (36, 37) from said parallel corresponding planes (33, 43) intersecting said central axis of said bore (27), the difference of said distances (36, 37) corresponding approximately to half the difference of said mounting distances (13, 17) of said electrical connectors (10, 14) of said first and second type.

19. A subrack in accordance with claim 18, characterized by said mounting bars (20) having an essentially rectangular cross-section, and that said mounting flanges (21, 22) extend from adjacent sides of said mounting bar (20).

* * * * *